United States Patent
Nilson et al.

(10) Patent No.: US 7,548,420 B2
(45) Date of Patent: Jun. 16, 2009

(54) ELECTRICAL DRIVE UNIT

(75) Inventors: Thord Agne Gustaf Nilson, Tyresö (SE); Ulf Bengt Ingemar Karlsson, Bagarmossen (SE)

(73) Assignee: Danaher Motion Stockholm AB, Stockholm (SE)

( * ) Notice: Subject to any disclaimer, the term of this patent is extended or adjusted under 35 U.S.C. 154(b) by 163 days.

(21) Appl. No.: 11/564,743

(22) Filed: Nov. 29, 2006

(65) Prior Publication Data
US 2007/0133180 A1 Jun. 14, 2007

(30) Foreign Application Priority Data
Dec. 8, 2005 (SE) .................................. 0502703

(51) Int. Cl.
*H05K 7/20* (2006.01)
(52) U.S. Cl. .................. 361/679.54; 361/701; 361/702; 361/709
(58) Field of Classification Search ................. 361/687, 361/704, 701, 702, 709
See application file for complete search history.

(56) References Cited
U.S. PATENT DOCUMENTS

| | | | | |
|---|---|---|---|---|
| 4,563,725 A * | 1/1986 | Kirby | ......................... | 361/708 |
| 4,821,051 A * | 4/1989 | Hediger | ....................... | 347/130 |
| 5,109,318 A * | 4/1992 | Funari et al. | ................. | 361/710 |
| 5,263,245 A * | 11/1993 | Patel et al. | ..................... | 29/840 |
| 5,959,840 A * | 9/1999 | Collins et al. | ................ | 361/713 |
| 6,141,220 A * | 10/2000 | Lin | ............................. | 361/704 |
| 6,580,611 B1* | 6/2003 | Vandentop et al. | ........... | 361/704 |
| 7,230,828 B2* | 6/2007 | Lee et al. | ..................... | 361/704 |
| 7,295,433 B2* | 11/2007 | Taylor et al. | ................. | 361/689 |
| 7,345,885 B2* | 3/2008 | Boudreaux et al. | .......... | 361/721 |
| 2004/0038583 A1* | 2/2004 | Peterson et al. | ............. | 439/485 |
| 2005/0007748 A1* | 1/2005 | Callahan et al. | ............. | 361/809 |
| 2006/0267192 A1* | 11/2006 | Chen | .......................... | 257/724 |

* cited by examiner

*Primary Examiner*—Jayprakash N Gandhi
*Assistant Examiner*—Anthony M Haughton
(74) *Attorney, Agent, or Firm*—Holland & Hart LLP

(57) ABSTRACT

The present invention relates to an electrical drive unit comprising a circuit board, a plurality of components, attached to a first side of the circuit board, a heat sink, arranged on the first side of the circuit board, a positioning assembly, arranged on a second side of the circuit board opposite the first side of the circuit board. The circuit board comprises a plurality of holes between the first and second sides, where through the positioning assembly has a plurality of protrusions arranged against the plurality of components, such that each component of the plurality of components individually is pressed against the heat sink by the positioning assembly.

12 Claims, 4 Drawing Sheets

ELECTRICAL DRIVE UNIT

FIELD OF INVENTION

The present invention relates generally to electrical drive units. Particularly the present invention relates to cooling of a plurality of components in an electrical drive unit.

BACKGROUND

An electrical drive unit includes a number of power generating components like transistors. Power transistors generate, apart from power, a lot of heat that needs to be transferred from the components to a heat sink. The best heat-conducting transistors have a metal surface on one side, the inside of which metal surface is connected to the transistor component, and in most cases the transistor component thus has to be electrically isolated from the heat sink. Such isolation is normally achieved by a thin ceramic substrate of aluminum oxide or some heat conductive rubber positioned between the metal surface and the heat sink.

Traditionally these transistors are mounted in an upright position along an edge of a printed circuit board (PCB) and are clamped to a heat sink. One problem with this method is that you have to place the transistors close to the edge of the PCB even if they electrically would be better placed in other portions of the PCB, such as the centre of the PCB. Another problem is that the PCB area has to be decreased, for a predetermined assembly size, if the heat sink is situated under the PCB, as one part of the heat sink has to protrude up in order to collect heat from the transistors and transport it down to the heat sink. Turning the board upside down diminishes this problem, but then the clamping of the transistors gets more complicated instead. Soldering the transistors in an upright position can also be difficult and requires soldering fixtures.

One known method for cooling of transistors is to place the transistors between the PCB and the heat sink and with a spring exert a pressure on the opposite side of the PCB in order to clamp the transistor against the heat sink, optionally with an electrical isolation between the transistors and the heat sink. The PCB is sometimes cut between the components to make it more flexible and ensure a good individual pressure for each component. A problem with this solution is that it takes up a large portion of the PCB area on both sides thereof, since both the transistors and the spring push against the PCB.

Another known way to cool transistors is to use a power module, a component consisting of a number of chip-bonded transistors. These power modules have one surface that is heat conductive and already electrically isolated. They often come in two parts where one is placed between the PCB and the heat sink and on the other side of the PCB is a lid placed that is providing a pressure towards the heat sink with the help of one or more screws. A problem with such power modules is that they are expensive and allocate a large PCB area.

A third known way to cool transistors is to use surface mounted power transistors on an additional special PCB built up with a thick aluminum layer at the bottom, which is quite an expensive solution. The transistors are then soldered so that the generated heat easily flows down through the board to a heat sink. The fact that you need two boards with power connections in between them increases production costs and makes the quality more difficult to control.

SUMMARY OF THE INVENTION

An object of the present invention is to provide efficient cooling of an electrical drive unit efficiently utilizing available area of a PCB.

This object, among others, is obtained by an electrical drive unit according to the appended claims.

By providing pressure from one side of the PCB, through a hole in the PCB, to components mounted on the other side of the PCB, efficient cooling of the components is obtained, at the same time achieving efficient utilization of available area on the PCB.

Further features and advantages of the present invention will be evident from the following description.

BRIEF DESCRIPTION OF THE DRAWINGS

The present invention will become more fully understood from the detailed description of embodiments given below and the accompanying figures, which are given by way of illustration only, and thus, are not limitative of the present invention, wherein.

DETAILED DESCRIPTION OF EMBODIMENTS

Figure 1:
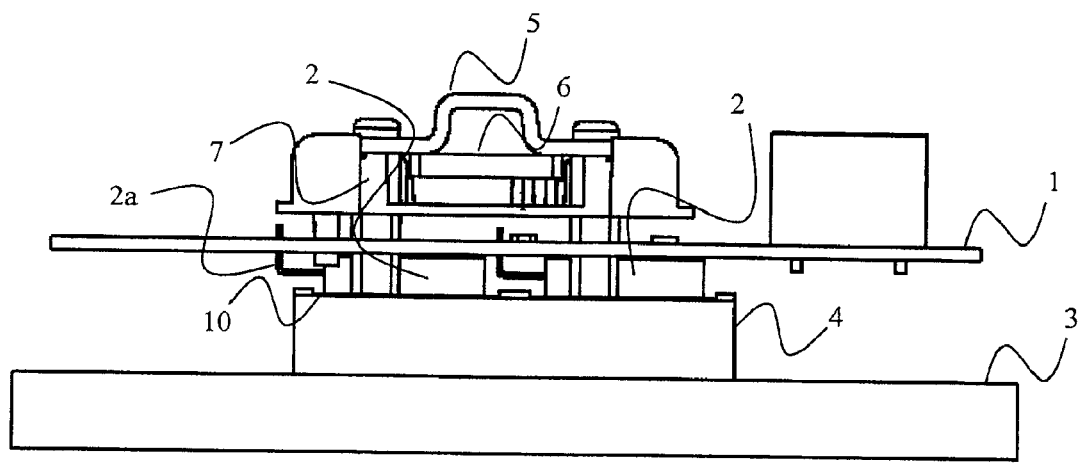
FIG. 1 shows a side view of an electrical drive unit according to a first embodiment of the present invention.

In the following description, for purpose of explanation and not limitation, specific details are set forth, such as particular techniques and applications in order to provide a thorough understanding of the present invention. However, it will be apparent for a person skilled in the art that the present invention may be practiced in other embodiments that depart from these specific details. In other instances, detailed description of well-known methods and apparatuses are omitted so as not to obscure the description of the present invention with unnecessary details.

A first embodiment of the present invention will now be described with reference to FIGS. 1-5.

An electrical drive unit comprises a circuit board (PCB) 1, a plurality of components 2 that need efficient cooling, such as power semiconductors, e.g. power transistors and power diodes, attached to a first side of the PCB 1, and a heat sink 3, 4 arranged on the first side of the PCB 1. The electrical drive unit further comprises a positioning assembly 5, 6, 7 arranged on a second side of the PCB 1, which second side is opposite the first side of the PCB 1. The electrical drive unit preferably also includes a cover (not illustrated) covering the PCB 1 and its plurality of components 2 and the positioning assembly 5, 6, 7 from the surroundings. The positioning assembly 5, 6, 7, the PCB 1 and the heat sink 3, 4 are preferably clamped together, e.g. by screws 13.

The heat sink 3, 4 is illustrated having a major part 3 and an elevation 4, but the heat sink 3, 4 can have any desired shape, which shape many times is specifically designed for each specific application.

Figure 2:
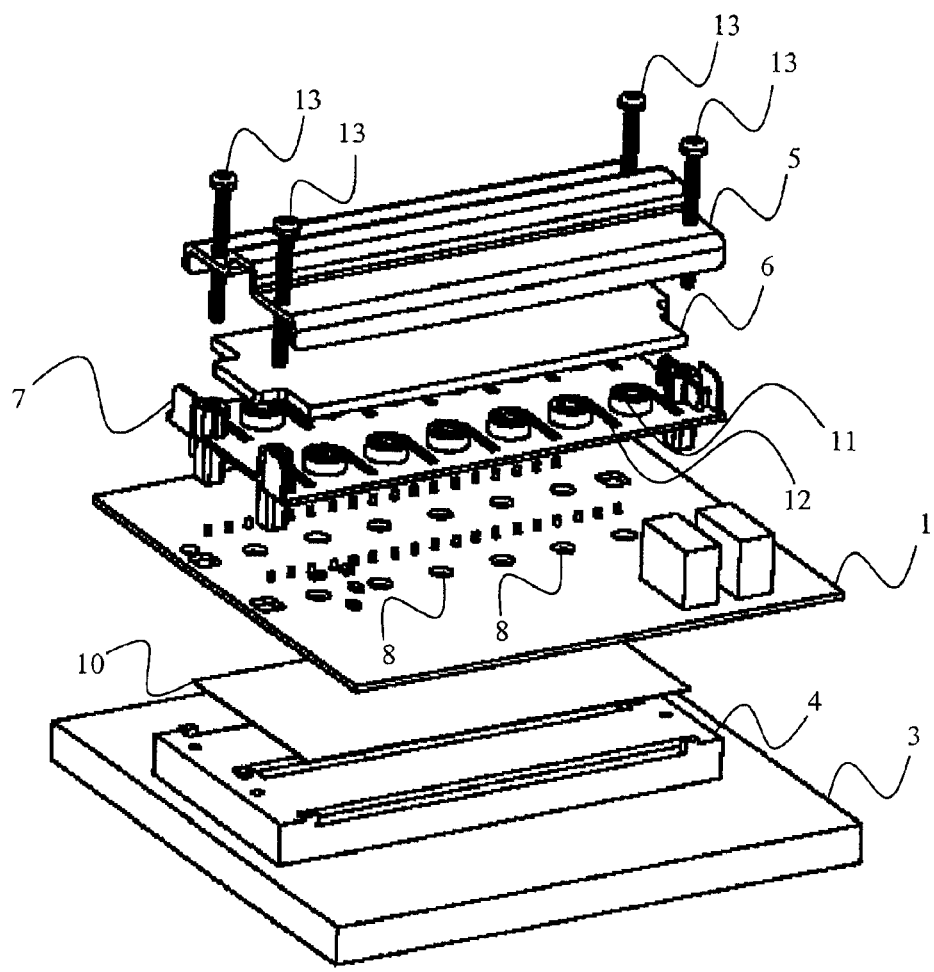
FIG. 2 shows an exploded perspective view of the electrical drive unit shown in FIG. 1.
Figure 3:
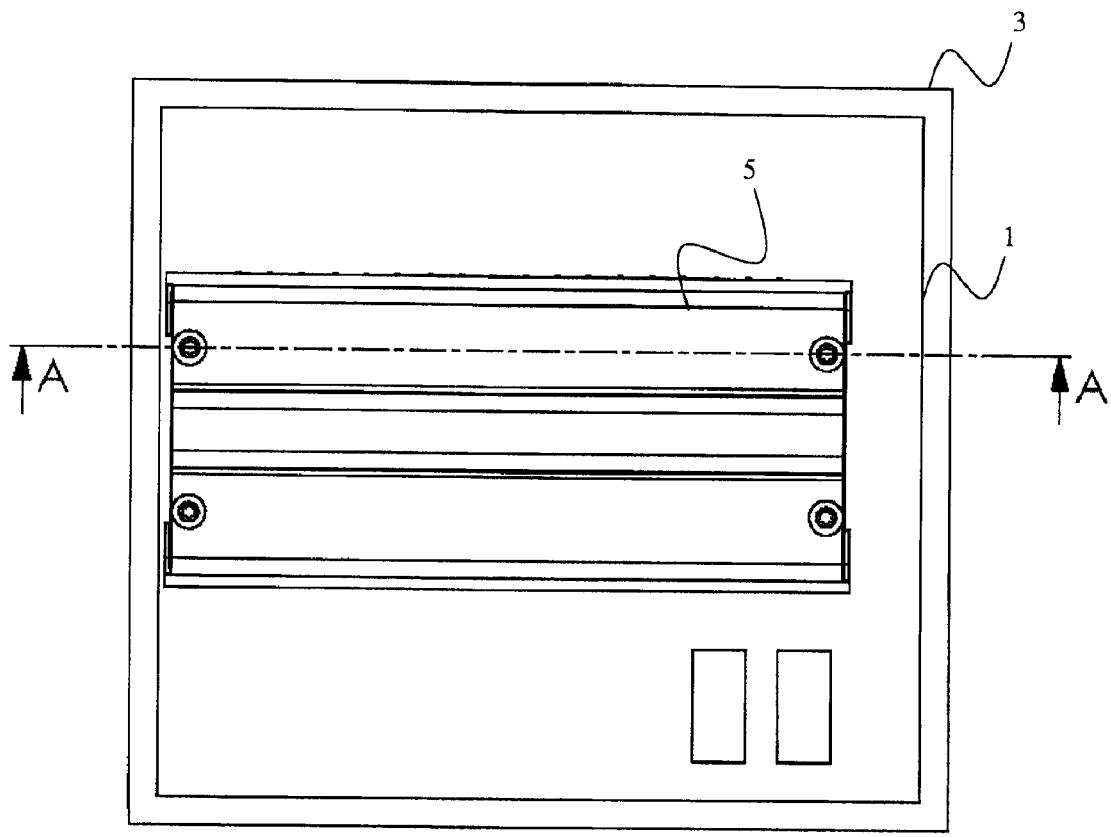
FIG. 3 shows a top view of the electrical drive unit shown in FIG. 1.
Figure 4:
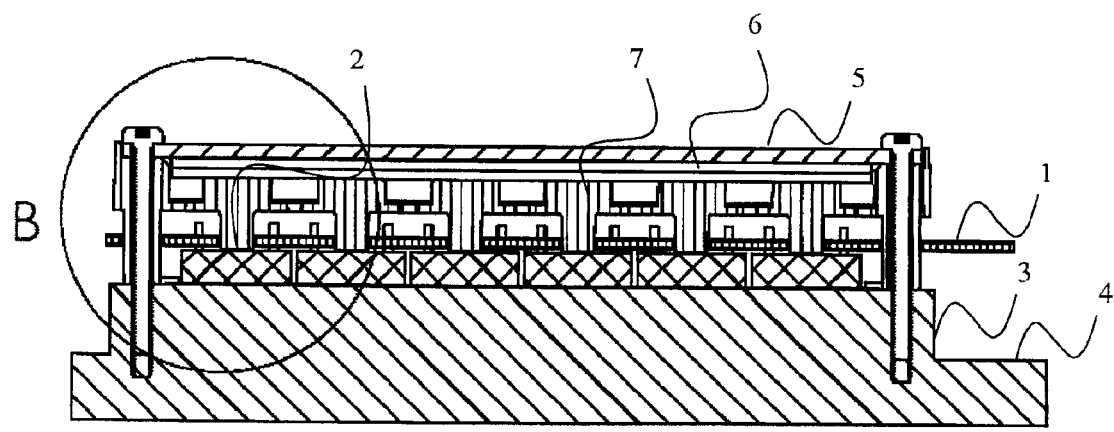
FIG. 4 shows a cut along the line A-A in FIG. 3.
Figure 5:
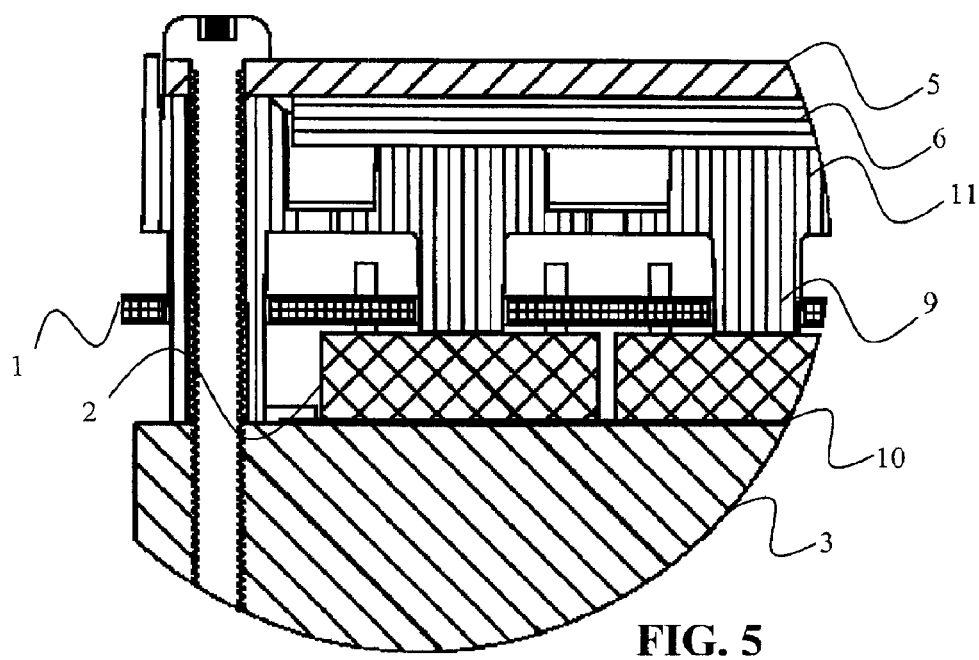
FIG. 5 shows a blown up portion B of FIG. 4.
Figure 7:
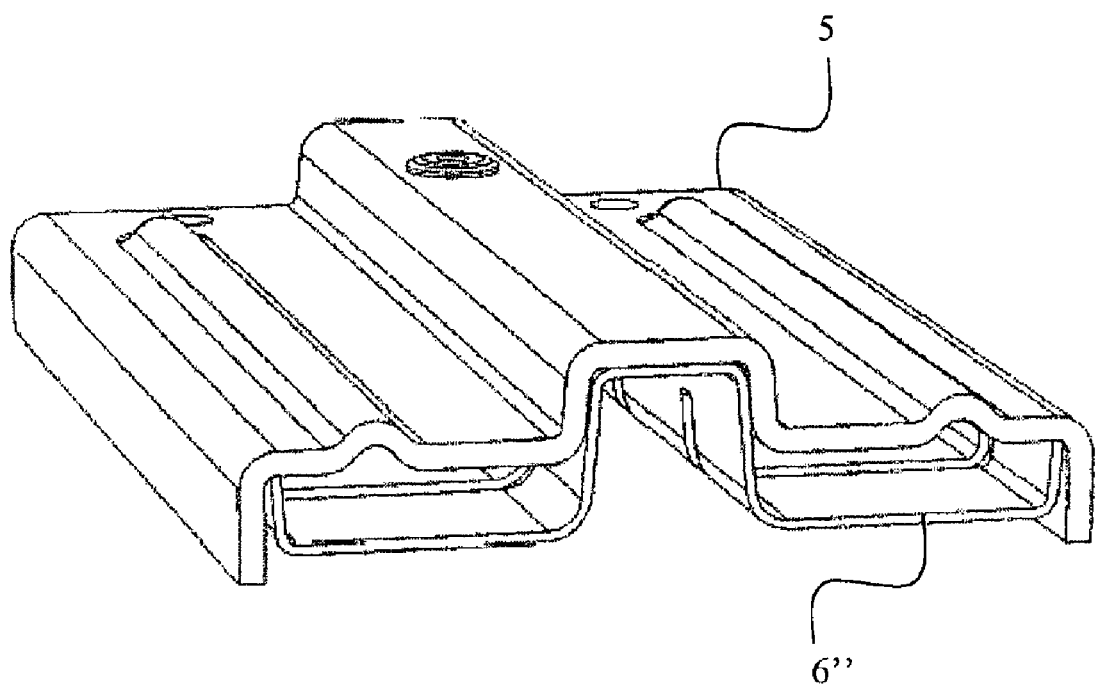
FIG. 7 shows a perspective view of an alternative positioning assembly.

The positioning assembly 5, 6, 7 preferably comprises a rigid part 5, a resilient part 6, and a dielectric spacer 7 sandwiched together, wherein the dielectric spacer 7 includes a plurality of protrusions 9. The positioning assembly 5, 6, 7 is preferably clamped together by screws 13, which also are used to clamp the positioning assembly 5, 6, 7 to the heat sink 3, 4. By providing the resilient part 6 between the rigid part 5 and the dielectric spacer 7 each of the plurality of protrusions 9 is individually pressing components towards the heat sink 3, 4. The rigid part 5 is preferably made of e.g. metal. The resilient part 6 is preferably made of e.g. rubber which is illustrated in FIG. 2, but could alternatively e.g. be constituted by a plurality of springs. An example of a resilient part 6″ made by a steel spring is illustrated in FIG. 7, which steel spring has an individual finger for each of the plurality of protrusions. The dielectric spacer 7 is preferably made of e.g. plastic, and is dielectric to allow attachment of other components on the second side of the PCB 1 close to the holes 8, where through the protrusions 9 are positioned. The dielectric spacer 7 is preferably also partly spaced apart from the second side of the PCB 1, to give room for other components attached on the second side of the PCB 1, close to the holes 8. The dielectric spacer 7 thus provides for efficient utilization of the PCB area.

The PCB 1 comprises a plurality of holes 8 between the first and second sides thereof. The positioning assembly 5, 6, 7 comprises the plurality of protrusions 9 arranged through the holes 8 and abut against the plurality of components 2. In this way each component 2 of the plurality of components 2 is individually pressed against the heat sink 3, 4 by a respective protrusion 9, to provide efficient cooling of each of the plurality of components 2. As the protrusions 9 press through the holes 8 of the PCB 1, this provides for efficient utilization of the PCB area.

The plurality of components 2 are illustrated as having bent legs 2a, to position each component essentially parallel to the PCB 1 and at a predetermined distance therefrom. Each of the plurality of components 2 preferably has an essentially flat cooling surface and legs 2a bent 90°. However, the components can be positioned in any desired way, such as essentially perpendicular to the PCB 1 or inclined somewhere there between, but the illustrated way allows the components to have a well-defined position between the PCB 1 and the heat sink 3, 4 despite having different thickness due to manufacturing tolerances. A further advantage with having the components 2 attached to the PCB 1 with bent legs is that the components project less height compared to components attached with straight or inclined legs, and it is in this way possible to wave solder other components attached to the PCB 1 if the components 2 e.g. are covered by a protective plastic cover during wave soldering. If the legs of the components are bent, the force of the press against each component has to be larger than the reaction force of the component due to the bent legs. However, if the protective plastic cover, or similar fixture, is used as soldering fixture and the components 2 are pressed against the soldering fixture, when soldering of the components 2 are performed, no additional force of the press against the heat sink 3 will be needed.

The PCB 1 can e.g. be provided with a separate hole 8 at least partly in line with a respective component 2 of the plurality of components 2. In this case the positioning assembly provides a separate protrusion 9 in each separate hole 8. It is also possible to provide a hole 8 at least partly in line with two or more of the components 2, but the larger each hole 8 is the less area is available for conductive strips or other components to be attached to the first and second sides of the PCB. However, one protrusion 9 is preferably used for each component 2, to obtain individual pressing of the components 2 towards the heat sink 3, 4. The design of a protrusion may take many forms, which e.g. may make a protrusion seem to press against several components, but what is important is that pressing of the components towards the heat sink is individual. It would also be possible to have a single protrusion press against more than one component, such as two components inclined 45 degrees from the PCB 1, but this would not provide the same reliability of cooling of each of the plurality of components 2.

The dielectric spacer 7 preferably comprises a plurality of projections 11, positioned opposite the plurality of protrusions 9, to further improve the individual pressing of the plurality of components 2. The dielectric spacer 7 preferably also comprises a plurality of apertures 12 between at least some of the protrusions 9, to further improve the individual pressing of the plurality of components 2. The plurality of protrusions 9 may alternatively consist of completely separate protrusions 9.

The electrical drive unit preferably comprises an electrical insulation 10, which also is thermally conductive, such as a ceramic substrate 10 of e.g. aluminum oxide, between the plurality of components 2 and the heat sink 3, 4. Each component 2 alternatively has an electrically insulating body package against the heat sink 3, 4. However, high performance power semiconductors are usually designed without any electrically insulating cover, to provide the best possible cooling capability.

To further increase the thermal conductivity between the plurality of components 2 and the heat sink 3, 4 thermal grease can be used between the heat sink 3, 4 and the ceramic substrate 10 as well as between the ceramic substrate 10 and the plurality of components 2.

Figure 6:
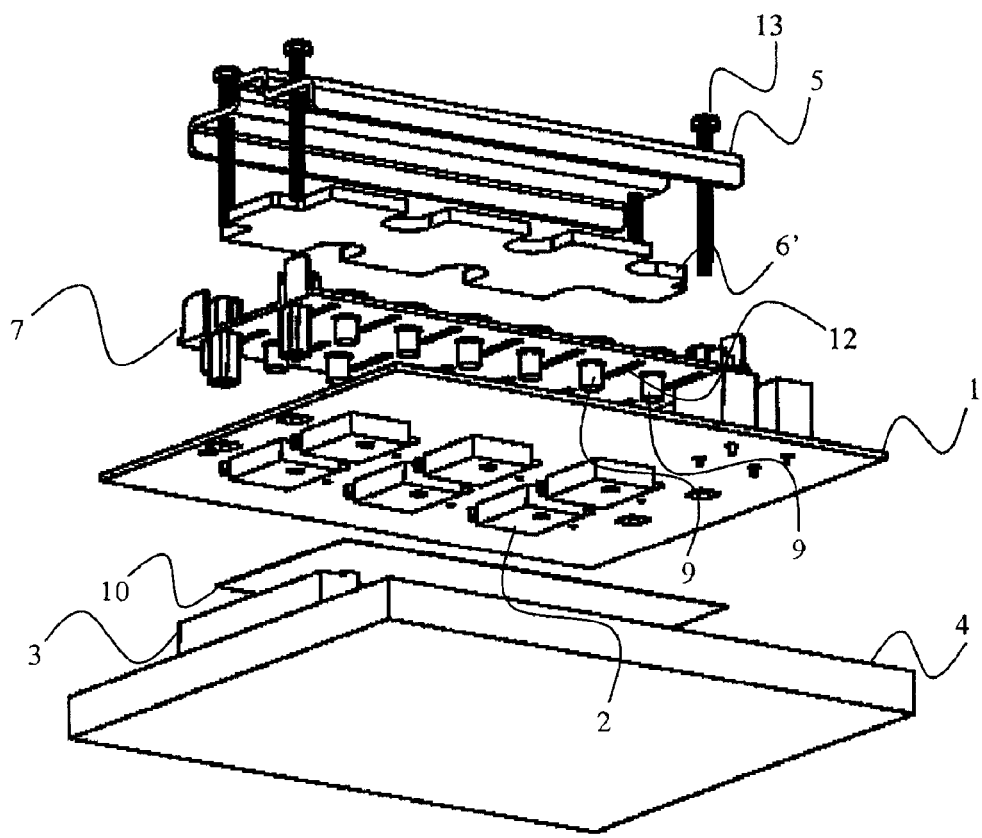
FIG. 6 shows an exploded perspective view from below of an electrical drive unit according to a second embodiment of the present invention.

A second embodiment of the present invention will now be described with reference to FIG. 6. This second embodiment of the present invention is identical to the first embodiment described above apart from the following.

The electrical driver unit has half as many components 2 compared to that of the first embodiment described above. The only part of the electrical driver unit that needs to be adapted due to this, with respect to cooling of the components 2, is the second resilient part 6′, which in this case has cut out portions over the unused component positions.

It will be obvious that the present invention may be varied in a plurality of ways. Such variations are not to be regarded as departure from the scope of the present invention. All such variations as would be obvious for a person skilled in the art are intended to be included within the scope of the present invention.

The invention claimed is:

1. An electrical drive unit comprising:
 a circuit board,
 a plurality of components, attached to a first side of said circuit board,
 a heat sink, arranged on said first side of said circuit board,
 a positioning assembly, arranged on a second side of said circuit board opposite said first side of said circuit board,
 said positioning assembly comprises a rigid part, a resilient part, and a dielectric spacer sandwiched together, wherein said dielectric spacer includes a plurality of protrusions and said dielectric spacer comprises a projection positioned opposite each protrusion of said plurality of protrusions, wherein said circuit board comprises a plurality of holes between said first and second sides, where through said positioning assembly has a plurality of protrusions extending through said plurality of holes and arranged against said plurality of components, such that each component of said plurality of components is individually pressed against said heat sink by said position assembly.

2. The electrical drive unit according to claim 1, comprising a ceramic substrate, or corresponding means, arranged between said heat sink and said plurality of components, to electrically insulate said plurality of components from said heat sink and to thermally connect said plurality of components to said heat sink.

3. The electrical drive unit according to claim 1, wherein said circuit board comprises a separate hole for each component of said plurality of components, and said positioning assembly has a protrusion arranged in each of said separate hole, wherein each hole is at least partly in line with a respective component.

4. The electrical drive unit according to claim 2, comprising thermal grease, or corresponding means, arranged between said plurality of components and said ceramic substrate, and between said ceramic substrate and said heat sink.

5. The electrical drive unit according to claim 1, wherein said protrusions are dielectric, preferably made of plastic.

6. The electrical drive unit according to claim 5, wherein said positioning assembly is partly spaced apart from said second side of said circuit board.

7. The electrical drive unit according to claim 1, wherein said resilient part is made of a steel spring with individual fingers for said plurality of protrusions.

8. The electrical drive unit according to claim 1, wherein each of said plurality of components has a flat cooling surface and is positioned essentially parallel to said circuit board, at a predefined distance there from.

9. The electrical drive unit according to claim 8, wherein each of said components is pressed against said heat sink with a force which is larger than the components reaction force due to being positioned essentially parallel to said circuit board.

10. The electrical drive unit according to claim 1, wherein said plurality of components is a plurality of power semiconductors.

11. The electrical drive unit according to claim 1, wherein said dielectric spacer comprises slots to improve said individual pressing of said plurality of components against said heat sink.

12. The electrical drive unit according to claim 1, wherein each protrusion of said plurality of protrusions press against a single component of said plurality of components.

* * * * *